(12) United States Patent
Sano

(10) Patent No.: US 8,873,243 B2
(45) Date of Patent: Oct. 28, 2014

(54) ELECTRONIC DEVICE

(71) Applicant: Denso Corporation, Kariya (JP)

(72) Inventor: Yoshimasa Sano, Anjo (JP)

(73) Assignee: Denso Corporation, Kariya (JP)

( * ) Notice: Subject to any disclaimer, the term of this patent is extended or adjusted under 35 U.S.C. 154(b) by 222 days.

(21) Appl. No.: 13/688,627

(22) Filed: Nov. 29, 2012

(65) Prior Publication Data

US 2013/0148317 A1     Jun. 13, 2013

(30) Foreign Application Priority Data

Dec. 12, 2011 (JP) ................................. 2011-271339

(51) Int. Cl.
H05K 5/00 (2006.01)

(52) U.S. Cl.
CPC ............ *H05K 5/0004* (2013.01); *H05K 5/0039* (2013.01); *H05K 5/006* (2013.01)
USPC ........... 361/756; 361/801; 361/802; 361/752; 206/706; 206/707

(58) Field of Classification Search
CPC ........................ G06F 3/044; H03K 17/9622
USPC ......... 361/752, 756, 802, 741, 736, 726, 732, 361/759; 211/41.14; 206/706, 707
See application file for complete search history.

(56) References Cited

U.S. PATENT DOCUMENTS

| | | | |
|---|---|---|---|
| 7,394,458 B2 * | 7/2008 | Lyon et al. ..................... | 345/173 |
| 7,880,479 B2 * | 2/2011 | Liao et al. ..................... | 324/679 |
| 8,269,743 B2 * | 9/2012 | Kuo et al. ..................... | 345/174 |
| 8,614,403 B2 * | 12/2013 | Tanaka et al. ................. | 200/600 |
| 8,698,001 B2 * | 4/2014 | Yu et al. ........................ | 174/250 |
| 8,717,330 B2 * | 5/2014 | Lu et al. ........................ | 345/174 |
| 2005/0270753 A1 | 12/2005 | Morisada | |
| 2010/0214247 A1 * | 8/2010 | Tang et al. .................... | 345/173 |
| 2010/0220075 A1 * | 9/2010 | Kuo et al. ..................... | 345/174 |
| 2014/0035864 A1 * | 2/2014 | Chang et al. .................. | 345/174 |

FOREIGN PATENT DOCUMENTS

| | | |
|---|---|---|
| JP | S53-141469 | 12/1978 |
| JP | S57-099909 | 6/1982 |
| JP | H01-139492 | 9/1989 |
| JP | H08-162779 | 6/1996 |
| JP | 2956502 | 7/1999 |
| JP | 2001-196758 | 7/2001 |
| JP | 2002-314264 | 10/2002 |
| JP | 2005-317692 | 11/2005 |
| JP | 2010-232207 | 10/2010 |

* cited by examiner

*Primary Examiner* — Lisa Lea Edmonds
*Assistant Examiner* — Keith Depew
(74) *Attorney, Agent, or Firm* — Harness, Dickey & Pierce, PLC

(57) ABSTRACT

In an electronic device, a circuit substrate is provided with at least one electronic circuit, and a case accommodates the circuit substrate. The case has a pair of groove portions and a side opening portion. The groove portions are provided, such that edge portions of the circuit substrate are slidable and inserted into the groove portions from the side opening portion. A box-shaped cover is disposed to close a bottom opening portion of the case. The cover includes a pair of side walls having top end portions, and a plurality of protrusion portions projecting from the top end portions of the side walls. The protrusion portions are inserted into a space between the edge portions of the circuit substrate and the groove portions, at a bottom side of the circuit substrate, to fix the circuit substrate.

8 Claims, 7 Drawing Sheets

ELECTRONIC DEVICE

CROSS REFERENCE TO RELATED APPLICATION

This application is based on Japanese Patent Application No. 2011-271339 filed on Dec. 12, 2011, the contents of which are incorporated herein by reference in its entirety.

TECHNICAL FIELD

The present disclosure relates to an electronic device in which a circuit substrate is accommodated in a case.

BACKGROUND

Conventionally, a circuit substrate accommodated in a case is fixed to a vehicle for protecting an attachment element on the circuit substrate. JP-A-2002-314264, JP-A-2005-317692, and JP-B2-2956502 describe a structure without using a fastener such as screw, so as to reduce a cost when the circuit substrate is fixed to the case.

The above structure basically includes a top case and a bottom case. The circuit substrate is inserted between the top case and the bottom case. A force for holding the circuit substrate is affected by an engagement state between the top case and the bottom case, and thereby the circuit substrate may be loosely received in the top case and the bottom case. Since the circuit substrate cannot be strongly received, one of the top case and the bottom case may be readily apart from the other one by an external force. Thus, rattling may be caused, and the circuit substrate and the element may be affected by an oscillation applied to the cases for a long time.

Further, an acceleration sensor or a gyro sensor may be attached to the circuit substrate. For example, an acceleration sensor for two directions is attached to an airbag electronic control unit (airbag ECU). Since the sensor on the circuit substrate is for measuring parameters relative to movement applied to the vehicle, a no-rattling state is necessary to be maintained between the circuit substrate and the cases. When the rattling occurs, the sensor cannot correctly measure the parameters, and an abnormality such as an erroneously detection may be caused. For example, a security device may activate when the security device should not be activated.

SUMMARY

It is an object of the present disclosure to provide an electronic device, in which a circuit substrate is fixable without a fastener such as screw, while rattling of the circuit substrate can be prevented.

According to an aspect of the present disclosure, an electronic device includes a circuit substrate, a case, and a cover. The circuit substrate is provided with at least one electronic circuit. The case has a bottom opening portion on a bottom side, and accommodates the circuit substrate. The case further has a pair of groove portions extending in a horizontal direction and being opposite to each other, and a side opening portion provided in a side surface and extending to a position adjacent to an end portion of the groove portion. The groove portions are provided, such that edge portions of the circuit substrate are slidable and inserted into the groove portions from the side opening portion so as to accommodate the circuit substrate in the case. The cover having an opening portion on a top side is box-shaped. The cover is disposed to close the bottom opening portion. The cover includes a pair of side walls having top end portions that extend in a direction parallel to an extending direction of the groove portions, and a plurality of protrusion portions projecting from the top end portions of the side walls. The protrusion portions are inserted into a space between the edge portions of the circuit substrate and the groove portions, at a bottom side of the circuit substrate, to fix the circuit substrate.

The circuit substrate is accommodated in the case by smoothly sliding the edge portions of the circuit substrate in the groove portions. Then, the cover is assembled to the case, so that the circuit substrate is protected by the cover. Because the circuit substrate is fixed by inserting the protrusion portion into a space between the edge portion of the circuit substrate and the groove portion, the circuit substrate can be held without using fastener such as screw, and rattling of the circuit substrate can be readily prevented.

BRIEF DESCRIPTION OF THE DRAWINGS

The above and other objects and advantages of the present disclosure will be more readily apparent from the following detailed description made with reference to the accompanying drawings. In the drawings.

DETAILED DESCRIPTION

Figure 1:
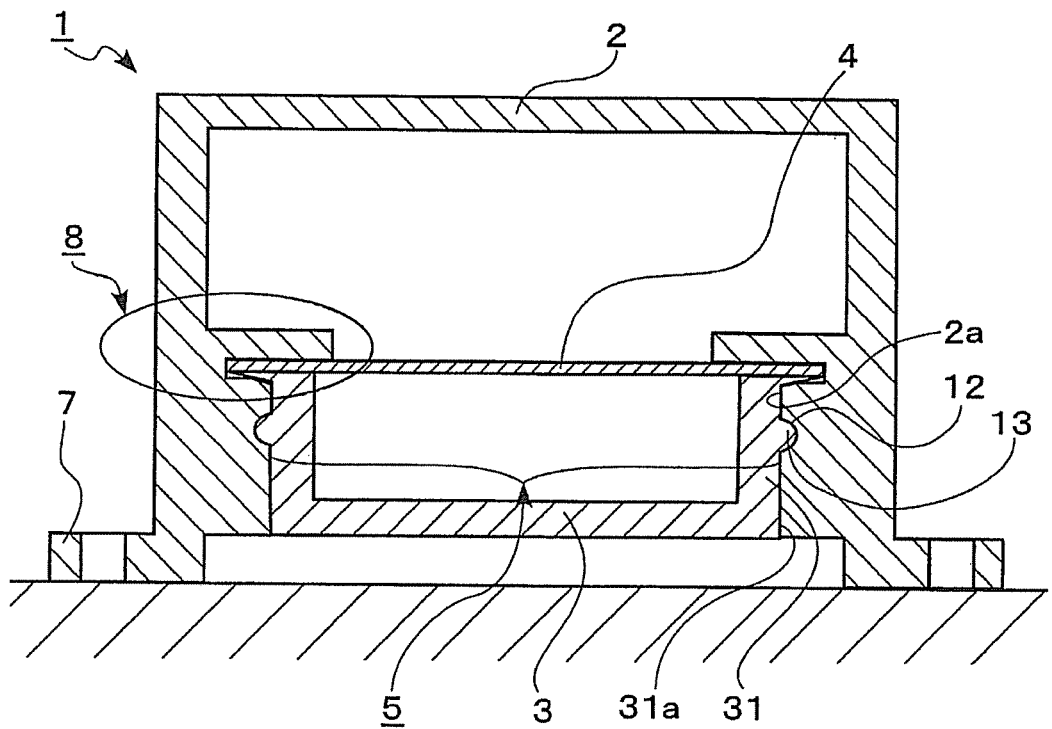
FIG. 1 is a cross-section view showing an electronic device according to an exemplar embodiment of the present disclosure.

Embodiments of the present disclosure will be described. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

Hereafter, an electronic device 1 according to an exemplar embodiment and other embodiments of the present disclosure will be described with reference to the drawings.

Figure 2:
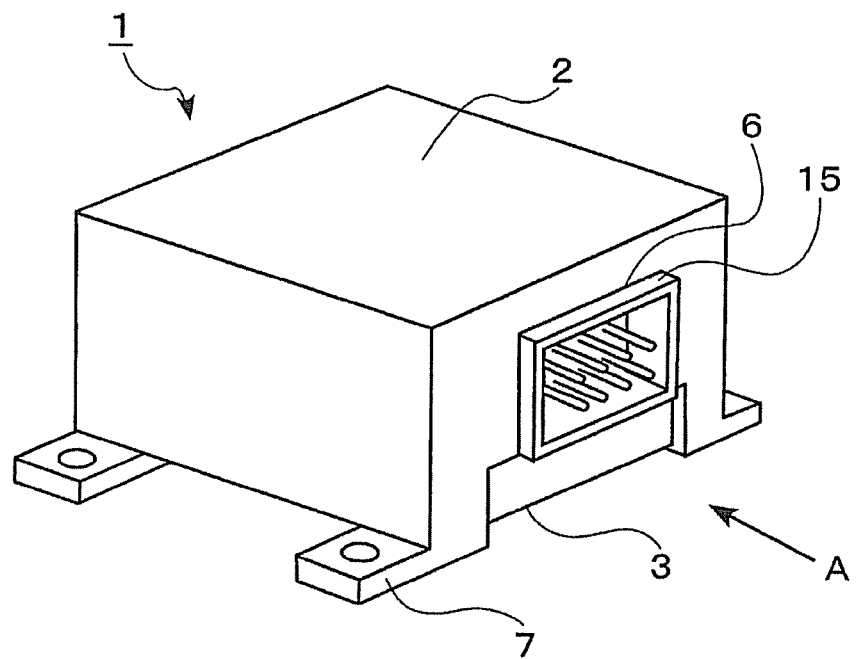
FIG. 2 is a perspective view showing an outline of the electronic device according to the exemplar embodiment of the present disclosure.

The electronic device 1 according to the present disclosure includes a case 2, a cover 3 and a circuit substrate 4. FIG. 1 is a cross-section view showing a structure of the electronic device 1 in a cross-section when being viewed from a direction of an arrow A of FIG. 2. FIG. 2 is a perspective view showing an outline of the electronic device 1 according to the exemplar embodiment.

Figure 3:
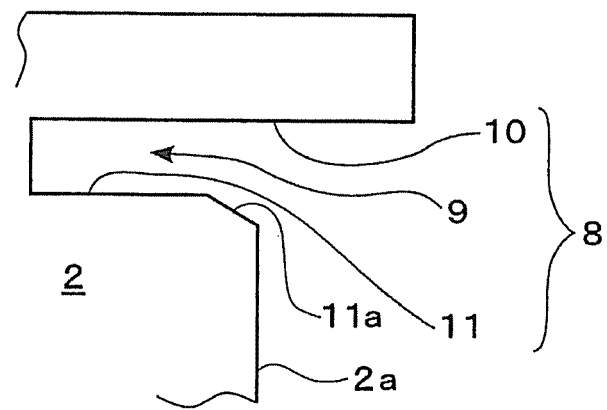
FIG. 3 is an enlarged view showing a part of a case adjacent to a groove portion of the electronic device.

The case 2, which is made of resin, includes a pair of groove portions 8, a bottom opening portion 5, a side opening portion 6, and a plurality of leg portions 7. The groove portions 8 are provided such that the circuit substrate 4 is slidable in the groove portions 8. Each groove portion 8 includes a groove 9, a top surface 10, and a bottom surface 11, as shown in FIG. 3. The top surface 10 has an area larger than the bottom surface 11 has. A tapered portion 11a is provided between the bottom surface 11 of the groove portion 8 and an inside surface 2a of the case 2, at a position adjacent to an opening portion of the groove 9. The tapered portion 11a declines from the bottom surface 11 of the groove portion 8 to the inside surface 2a of the case 2. Because the above shape of the tapered portion 11a, a protrusion portion 14 of the cover 3 can readily be inserted into the groove 9. The bottom opening portion 5 is provided in the case 2 for accommodating the cover 3. A plurality of concave portions 12 is provided in the inside surface 2a of the case 2 at the bottom opening portion 5 so as to fix the cover 3 made of resin. For example, both the case 2 and the cover 3 may be made of resin such as polypropylene (PP). The side opening portion 6 is provided in a side surface of the case 2, to extend to a position adjacent to an end portion of the groove portion 8 for accommodating the circuit substrate 4. The leg portions 7 are provided for fixing the electronic device 1.

The cover 3 is box-shaped and has an opening portion at a top side. A pair of outside surfaces 31a of side walls 31 of the cover 3, which are inserted into the bottom opening portion 5 of the case 2, includes a plurality of convex portions 13. A width between the outside surfaces 31a of the side walls 31 is set to be substantially the same as the width between the inside surfaces 2a of the case 2 at the bottom opening portion 5, such that the cover 3 can be inserted into the bottom portion 5. In the exemplar embodiment, the convex portions 13 are projected as doom-shaped shown in FIG. 4, and the concave portions 12 are provided as bowl-shape corresponding to the doom-shape. Each convex portion 13 is placed at a position crossing to the inside surface 2a of the case 2 at the bottom opening portion 5.

Figure 4:
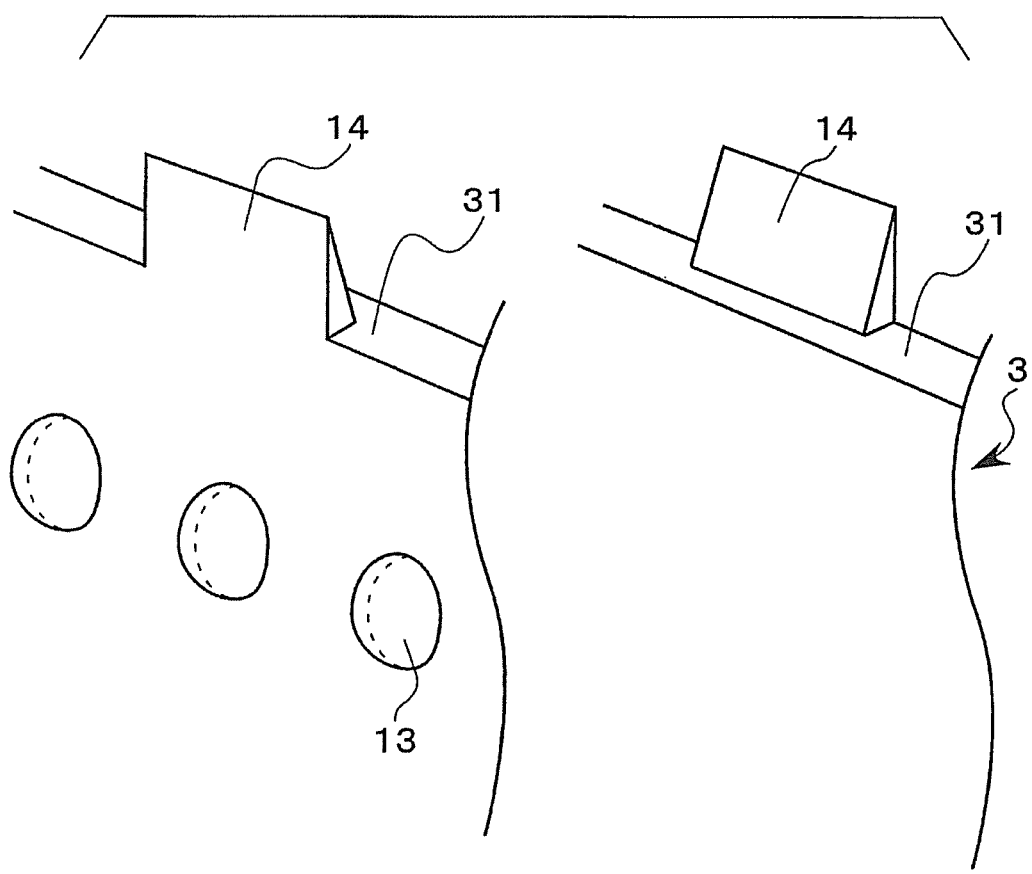
FIG. 4 is a perspective view showing a protrusion portion and a convex portion, which are provided in a side wall of a cover.

For example, four protrusion portions 14 are provided to protrude from the side wall 31 in the opening portion of the cover 3. Each protrusion portion 14 extends along an edge of the side wall 31 as shown in FIG. 4, and a cross-section of the protrusion portion 14 is right-triangle-shaped, before the cover 3 is assembled to the case 2. As shown in FIG. 1, the protrusion portions 14 are crushed and inserted into the grooves 9 of the case 2 when the cover 3 is assembled to the case 2. The crushed protrusion portions 14 are inserted between the circuit substrate 4 and the bottom surface 11 so as to press the circuit substrate 4 toward the top surface 10.

The circuit substrate 4, in which electrical elements (now shown) are attached, is a printed circuit substrate including a connector 15 for connecting to exterior. The circuit substrate 4 is accommodated and held by the pair of groove portions 8 of the case 2.

An assembling method of the electronic device 1 according to the exemplar embodiment will be described with reference to FIG. 5.

The circuit substrate 4 is inserted into and slid in a pair of the grooves 9 of the case 2 from the side opening portion 6 such that the connector 15 can project from the side opening portion 6. A height dimension of the groove 9 (a dimension between the top surface 10 and the bottom surface 11) is slightly larger than a thickness of the circuit substrate 4. That is, an additional space except for an insertion space of the circuit substrate 4 is provided between the circuit substrate 4 and the groove 9, such that the circuit substrate 4 is slidable in the groove 9. A friction occurred between the top surface 10, the circuit substrate 4 and the bottom surface 11, may become increase in accordance with a decrease in the additional space. When the friction is increased, the circuit substrate 4 may be difficult to be slidable in the groove 9, and assembling hours may become larger. When the additional space has a certain extent size, the circuit substrate 4 can be readily inserted into the groove 9 for a short time. In a view of reducing the assembling hours, the height dimension of the groove 9 may be set as 2.3 mm with respect to the thickness of the circuit substrate 4 set as 1.6 mm, such that the circuit substrate 4 can be smoothly slid in the groove 9.

Then, the cover 3 is inserted and pressed into the case 2 by using a specified force from the bottom opening portion 5, while the opening portion of the cover 3 opposites the bottom opening portion 5 of the case 2. The assembled case is shown in FIG. 2. Because the side wall 31 can be bent by an elasticity of resin, the convex portions 13 can be inserted into the bottom opening portion 5 when the cover 3 is inserted into the case 2. Further, the convex portions 13 are fitted into the concave portions 12, and the bending of the convex portions 13 is recovered in the concave portions 12 by the elasticity of resin. Because the cover 3 is fixed to the case 2 by a structure of the convex portions 13 and the concave portions 12, the cover 3 cannot fall from the case 2 even when the specified force disappears. Thus, the protrusion portions 14 are not necessary to support the cover 3, and the protrusion portions 14 may be completely crushed after the assembling of the case 2 and the cover 3. The thickness of the cover 3 may be in a range from 1.2 mm to 2 mm.

When the convex portions 13 are fitted into the concave portions 12, the protrusion portions 14 press-contact the circuit substrate 4. Then, the protrusion portions 14 are deformed and crushed, and inserted between the circuit substrate 4 and the bottom surface 11 in the grooves 9 as shown in FIG. 1. The tapered portion 11a provided at a position adjacent to the opening portion of the groove 9 has a shape such that the protrusion portions 14 of the cover 3 can be readily inserted into the grooves 9. The inserted protrusion portions 14 press the circuit substrate 4 toward the top surface 10 so as to absorb a space including the additional space between the circuit substrate 4 and the bottom surface 11.

Therefore, it can prevent the circuit substrate 4 from moving (rattling) in the groove 9. Thus, when an acceleration sensor or a gyro sensor is attached to the circuit substrate 4, a detection error caused by the rattling can be prevented. The acceleration sensor measures an acceleration of a vehicle, and the gyro sensor measures a roll angle or a yaw rate of an engine.

Figure 5:
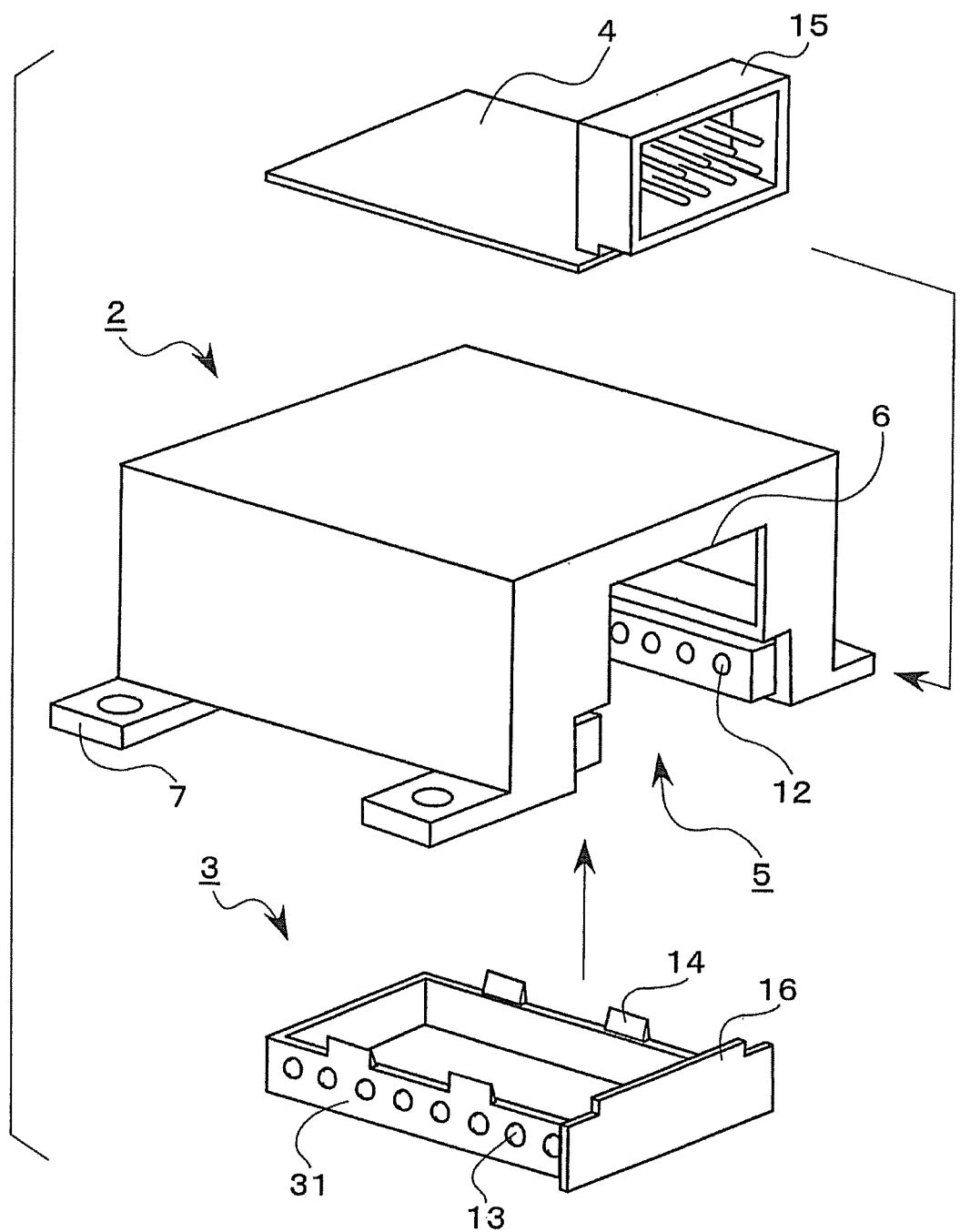
FIG. 5 is an exploded perspective view showing an assembling method of the electronic device according to the exemplar embodiment of the present disclosure.
Figure 6:
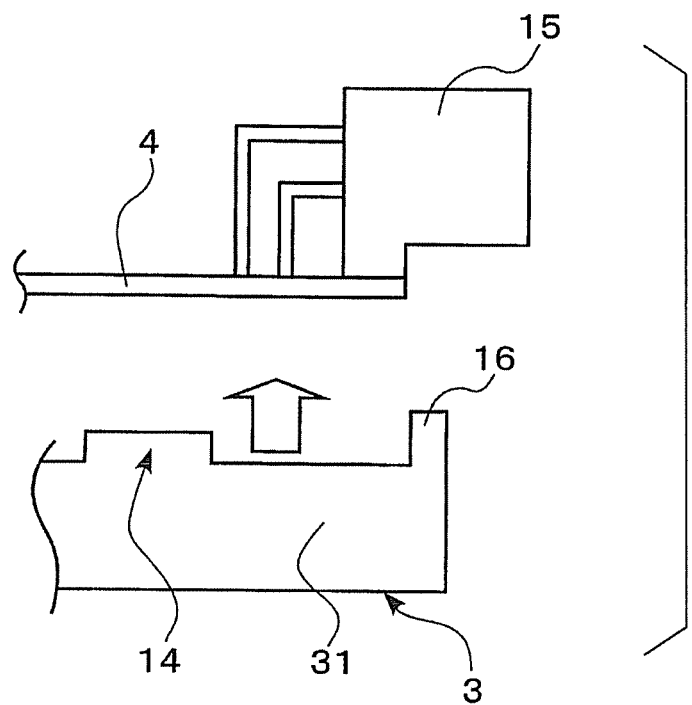
FIG. 6 is a schematic view showing a relationship of the cover and a circuit substrate, according to the exemplar embodiment of the present disclosure.

The cover 3 further includes a seal portion 16 as shown in FIGS. 5 and 6. The seal portion 16 placed at a position corresponding to the connector 15 is projected from the side wall 31 toward the circuit substrate 4 such that an end portion of the circuit substrate 4 adjacent to the connector 15 can be sealed by the seal portion 16. Thus, a sealability of the present disclosure is improved, and the circuit substrate 4 can locate at an accurate position in an insert direction when the cover 3 is assembled to the case 2. Further, the seal portion 16 is projected from the side wall 31 of the cover 3 in a horizontal direction (width direction of the side wall 31), such that the groove portions 8 can be protected from an adherence of foreign substances. Then, the electronic device 1 as an ECU is attached to a specified location of the vehicle by fixing the leg portions 7 to the vehicle using fasteners, such as bolts. A setting of the electronic device 1 is completed by connecting the connector 15 to the exterior.

The groove portion 8 is provided in the case 2, such that both the top surface 10 and the bottom surface 11 are belong to the case 2. Thus, the circuit substrate 4 is held only by the case 2. The cover 3 is only for reducing the moving between the circuit substrate 4, the top surface 10 and the bottom surface 11. For example, another structure, in which the circuit substrate 4 is held by both a top case and a bottom case, and the bottom case is fixed to a vehicle, may be used. In this case, even when a relatively-small external force is applied to the top case, the force may be transmitted to press to the circuit substrate 4. In the exemplar embodiment, the circuit substrate 4 is held only by the case 2, and the cover 3 is used such that the convex portions 13 are respectively fitted into the concave portions 12. Therefore, it can prevent an external force from readily being transmitted to the circuit substrate 4 since the case 2 is made strongly.

According to the exemplar embodiment, the electronic device 1 includes the circuit substrate 4, the case 2, and the cover 3. The circuit substrate 4 is provided with at least one electronic circuit. The case 2 has the bottom opening portion 5 on the bottom side, and accommodates the circuit substrate 4. The case 2 has a pair of groove portions 8 extending in the horizontal direction and being opposite to each other, and the side opening portion 6 provided in the side surface and extending to a position adjacent to the and portion of the groove portion 8. The groove portions 8 are provided, such that edge portions of the circuit substrate 4 are slidable and inserted into the groove portions 8 from the side opening portion 6 so as to accommodate the circuit substrate 4 in the case 2. The cover 3 having the opening portion on the top side is box-shaped. The cover 3 is disposed to close the bottom opening portion 5. The cover 3 includes a pair of side walls 31 having top end portions that extend in a direction parallel to an extending direction of the groove portions 8, and a plurality of protrusion portions 14 projecting from the top end portions of the side walls 31. The protrusion portions 14 are inserted into a space between the edge portions of the circuit substrate 4 and the groove portions 8, at the bottom side of the circuit substrate 4, to fix the circuit substrate 4.

The circuit substrate 4 is accommodated in the case 2 while the edge portions of the circuit substrate 4 are smoothly slid in the groove portions 8. After the cover 3 is assembled to the case 2, the circuit substrate 4 is protected by the cover 3. Because the circuit substrate 4 is fixed by inserting the protrusion portion 14 into the space between the edge portion and the groove portion 8, the circuit substrate 4 can be tightly held without using fastener such as screw, and rattling of the circuit substrate 4 can be prevented.

Further, a bottom end portion of the case 2 includes a plurality of the leg portions 7 for attaching the case 2 to a subject provided at the bottom end portion, and the cover 3 is positioned at the inside surface 2a of the case 2. Thus, the case 2 can be fixed to the subject such as a vehicle, by using the leg portions 7. Since the cover 3 is positioned at the inside surface 2a of the case 2, the cover 3 is fixed without contacting the subject. Since the circuit substrate 4 is only fixed to the case 2, the circuit substrate 4 can be held to prevent from being pressed by an extra force even when the case 2 is pressed by the extra force.

The present disclosure is not limited to the exemplar embodiment, and may be modified in various ways without departing the scope of the present disclosure.

Figure 7:
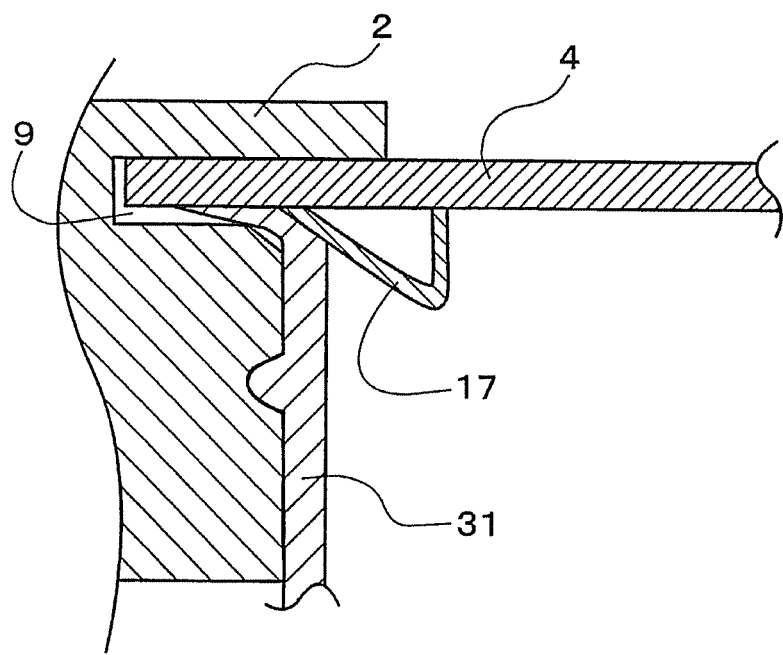
FIG. 7 is a cross-section view showing a fixation structure of the circuit substrate according to another embodiment of the present disclosure.
Figure 8A:
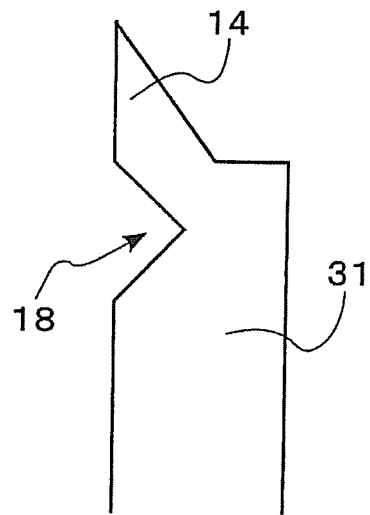
FIGS. 8A and 8B are enlarged views showing a part of a cover adjacent to the protrusion portion according to another two embodiments of the present disclosure.
Figure 8B:
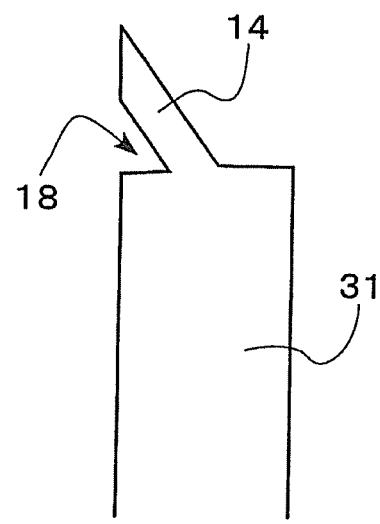

For example, a guide plate 17 is made of metal as a guide portion, and is provided at the bottom surface of the circuit substrate 4 as shown in FIG. 7. A cross-section of the guide plate 17 may be a triangle. The guide plate 17 may guide the protrusion portion 14 from the tapered portion 11a toward an inside portion of the groove 9. Alternatively, instead of the guide plate 17, a land may be provided at the bottom surface of the circuit substrate 4, and solder may be accumulated in a taper-shape so as to guide the protrusion portion 14.

The number of the protrusion portions 14 is not limited to four. A proper number may be set. For example, two protrusion portions 14 may be respectively provided at each edge of the side walls 31 such that each protrusion portion 14 covers the whole edge of each side wall 31. Alternatively, a narrowed portion 18 may be provided at a base part of the protrusion portion 14 such that the protrusion portion 14 can be readily deformed toward the groove 9.

Figure 9A:
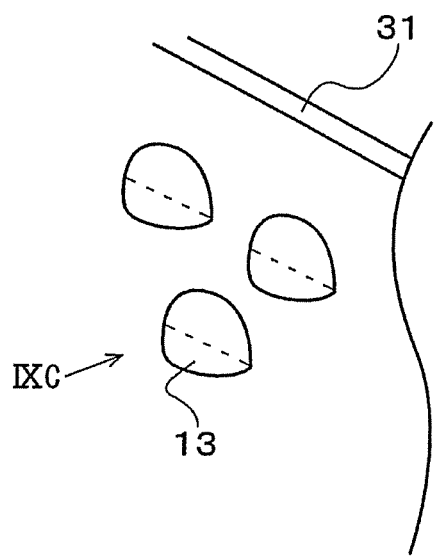
FIGS. 9A and 9B are perspective views showing convex portions of a cover according to another two embodiments of the present disclosure.
Figure 9B:
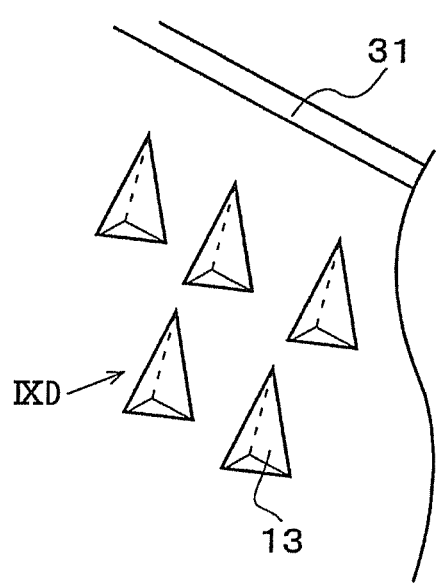
Figure 9C:
FIG. 9C is a plan view of one convex portion viewed from a direction of an arrow IXC in FIG. 9A.
Figure 9D:
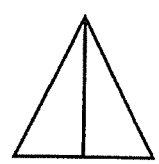
FIG. 9D is a plan view of one convex portion viewed from a direction of an arrow IXD in FIG. 9B.

The shape of the convex portions 13 is not limited to doom-shape. For example, the convex portion 13 may be a semicircular in planar view as shown in FIG. 9C. Alternatively, the convex portion 13 may be triangle-shaped in planar view as shown in FIG. 9D, in a case where the convex portion 13 is tetrahedron-shaped. In this case, the cover 3 can be readily inserted into the case 2. Further, a plurality of lines of the convex portions 13 may be arranged in a manner that the convex portions 13 in each line are shifted by a half pitch with respect to the convex portions 13 in another line. Furthermore, different shapes of the convex portions 13 may be combined. The concave portions 12 are shaped corresponding to the above convex portions 13.

Figure 10:
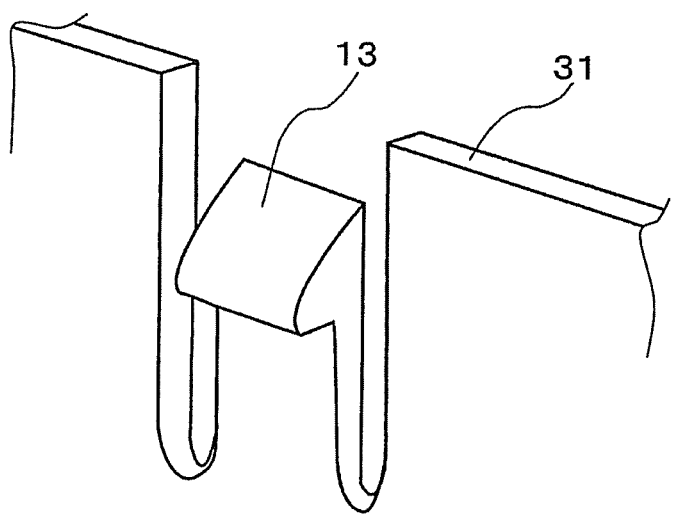
FIG. 10 is a perspective view showing a convex portion of a cover according to another embodiment of the present disclosure.

As shown in FIG. 10, by using the elasticity of resin, the convex portion 13 may be provided at the side wall 31 as a hook-shaped snap-fit. Two cutting portions are provided at two sides of the convex portion 13 such that the cover 3 can be readily inserted into or taken out from the case 2. For example, the cover 3 can be readily taken out from the case 2, when a malfunction analysis of the circuit substrate 4 is implemented, or when dismantlement is necessary according to a life-cycle of the product.

Figure 11A:
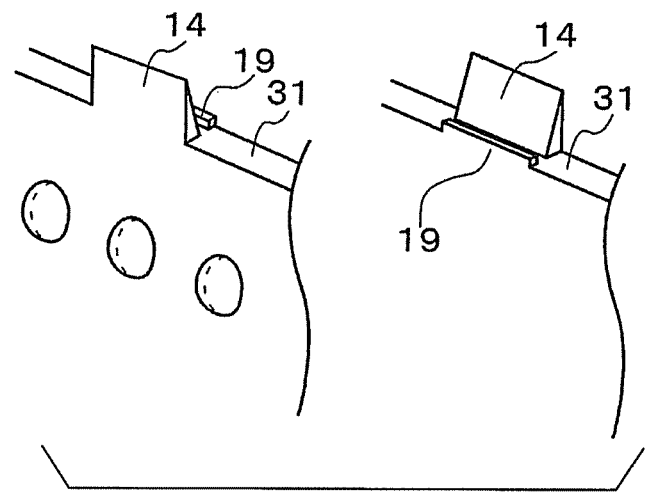
FIG. 11A is a perspective view showing a part of a cover according to another embodiment of the present disclosure.
Figure 11B:
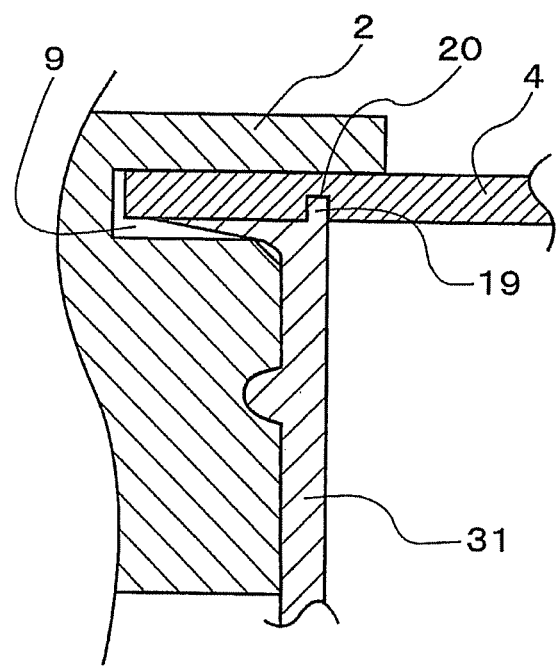
FIG. 11B is a cross-section view showing a fixation structure of a circuit substrate in a case and the cover shown in FIG. 11A.

According to the example shown in FIG. 11A, a fixation convex portion 19 is further provided at the edge of the side wall 31 adjacent to the base part of the protrusion portion 14 so as to fix the circuit substrate 4 to the cover 3. As shown in FIG. 11B, a fixation concave portion 20 provided in the circuit substrate 4 is fitted to the fixation convex portion 19. Thus, a movement in a horizontal direction can be reduced. In addition, the fixation concave portion 20 may also be provided as a penetration hole.

The tapered portion 11a of the bottom surface 11 may be not necessary, when the protrusion portion 14 CaO be completely inserted into the groove 9 such that the additional space between the circuit substrate 4 and the bottom surface 11 is absorbed.

A plurality of doom-shaped convex portions may be provided at the inside surface 2a of the case 2. In this case, a plurality of bowl-shaped concave portions may be provided at the outside surface 31*a* of the side wall 31. Alternatively, a plurality of penetration holes corresponding to the doom-shaped convex portions may be provided at the outside surface 31*a* of the side wall 31.

The material of the case 2 and the cover 3 is not limited to PP. Other resin may be used, such as polybutylene terephthalate (PBT), polyethylene-telephthalate (PET), polycarbonate (PC), ABS resin, or polymer alloy. The resin may be conductive grade, or may include filling material such as glass fiber or carbon fiber. Further, the material of the case 2 and the cover 3 may be different from each other.

According to a first aspect of the present disclosure, an electronic device includes a circuit substrate, a case, and a cover. The circuit substrate is provided with at least one electronic circuit. The case has a bottom opening portion on a bottom side, and accommodates the circuit substrate. The case further has a pair of groove portions extending in a horizontal direction and being opposite to each other, and a side opening portion provided in a side surface and extending to a position adjacent to an end portion of the groove portion. The groove portions are provided, such that edge portions of the circuit substrate are slidable and inserted into the groove portions from the side opening portion so as to accommodate the circuit substrate in the case. The cover having an opening portion on a top side is box-shaped. The cover is disposed to close the bottom opening portion. The cover includes a pair of side walls having top end portions that extend in a direction parallel to an extending direction of the groove portions, and a plurality of protrusion portions projecting from the top end portions of the side walls. The protrusion portions are inserted into a space between the edge portions of the circuit substrate and the groove portions, at a bottom side of the circuit substrate, to fix the circuit substrate.

The circuit substrate is accommodated in the case by smoothly sliding the edge portions of the circuit substrate in the groove portions. Then, the cover is assembled to the case, on that the circuit substrate is protected by the cover. Because the circuit substrate is fixed by inserting the protrusion portion into a space between the edge portion of the circuit substrate and the groove portion, the circuit substrate can be held without using fastener such as screw, and rattling of the circuit substrate can be readily prevented.

According to a second aspect of the present disclosure, the case may include a plurality of the leg portions for attaching the case to a subject provided in the bottom end portion, and the cover may be positioned at the inside surface of the case.

Thus, the case can be fixed to the subject such as a vehicle, by using the leg portions. Since the cover is positioned at the inside surface of the case, the cover is fixed without contacting the subject. Since the circuit substrate is only fixed to the case, the circuit substrate can be held to prevent from being pressed by an extra force even when the case is pressed by the extra force.

According to a third aspect of the present disclosure, a convex portion may be provided in one of an outside surface of the cover and the inside surface of the case, and a concave portion may be provided in the other one of the outside surface of the cover and the inside surface of the case. The cover may be fixed to the case by a fitting of the convex portion into the concave portion.

Since the case and the cover are fixed by the convex portion and the concave portion, it is not necessary to use a fastener such as screw or binder. Thus, the case and the cover can be fixed by using a smaller number of elements.

According to a fourth aspect of the present disclosure, the protrusion portion may have a base part connected to the top end portion of the side wall, and the base part may be narrowed to have a narrowed portion.

According to a fifth aspect of the present disclosure, a tapered portion may be provided between a bottom surface of the groove portion and the inside surface of the case. The tapered portion may decline from the bottom surface of the groove portion to the inside surface of the case.

According to a sixth aspect of the present disclosure, a guide portion may be disposed at a bottom surface of the circuit substrate to guide the protrusion portion into an inside portion of the groove.

According to a seventh aspect of the present disclosure, a fixation convex portion may be provided in the cover at a position adjacent to the base part of the protrusion portion. A fixation concave portion, into which the fixation concave portion is fitted, may be provided in the circuit substrate. The fixation convex portion and the fixation concave portion may be engaged with each other, when the protrusion portion is inserted into a space between the edge portion of the circuit substrate and the groove portion from the bottom side of the circuit substrate.

According to an eighth aspect of the present disclosure, the circuit substrate may be provided with an acceleration sensor or a gyro sensor.

While the present disclosure has been described with reference to the embodiments thereof, it is to be understood that the disclosure is not limited to the embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. An electronic device comprising:
   a circuit substrate provided with at least one electronic circuit;
   a case that has a bottom opening portion on a bottom side, and accommodates the circuit substrate; and
   a box-shaped cover having an opening portion on a top side, the cover being disposed to close the bottom opening portion, wherein
   the case has a pair of groove portions extending in a horizontal direction and being opposite to each other, and a side opening portion provided in a side surface and extending to a position adjacent to an end portion of the groove portion,
   the groove portions are provided, such that edge portions of the circuit substrate are slidable and inserted into the groove portions from the side opening portion so as to accommodate the circuit substrate in the case,
   the cover includes a pair of side walls having top end portions that extend in a direction parallel to an extending direction of the groove portions, and a plurality of protrusion portions projecting from the top end portions of the side walls, and
   the protrusion portions are inserted into a space between the edge portions of the circuit substrate and the groove portions, at a bottom side of the circuit substrate, to fix the circuit substrate.

2. The electronic device according to claim 1, wherein
   a bottom end portion of the case includes a plurality of leg portions for attaching the case to a subject provided at the bottom end portion, and
   the cover is positioned at an inside surface of the case.

3. The electronic device according to claim 1, further comprising:

a convex portion provided in one of an outside surface of the cover and an inside surface of the case; and a concave portion provided in the other one of the outside surface of the cover and the inside surface of the case, wherein the cover is fixed to the case by a fitting of the convex portion into the concave portion.

4. The electronic device according to claim 1, wherein the protrusion portion has a base part connected to the top end portion of the side wall, and the base part is narrowed to have a narrowed portion.

5. The electronic device according to claim 1, further comprising a tapered portion provided between a bottom surface of the groove portion and an inside surface of the case, wherein the tapered portion declines from the bottom surface of the groove portion to the inside surface of the case.

6. The electronic device according to claim 1, further comprising a guide portion disposed at a bottom surface of the circuit substrate to guide the protrusion portion into an inside portion of the groove.

7. The electronic device according to claim 1, further comprising:

a fixation convex portion provided in the cover at a position adjacent to a base part of the protrusion portion; and a fixation concave portion into which the fixation convex portion is fitted, the fixation concave portion being provided in the circuit substrate, wherein the fixation convex portion and the fixation concave portion are engaged with each other, when the protrusion portion is inserted into a space between the edge portion of the circuit substrate and the groove portion from a bottom side of the circuit substrate.

8. The electronic device according to claim 1, wherein the circuit substrate is provided with an acceleration sensor or a gyro sensor.

* * * * *